(12) United States Patent
Thompson

(10) Patent No.: US 10,398,047 B2
(45) Date of Patent: Aug. 27, 2019

(54) DECORATIVE COVER FOR AN ELECTRICAL PANEL AND METHOD OF MAKING THE SAME

(71) Applicant: Lindsay Thompson, Grand Cayman (KY)

(72) Inventor: Lindsay Thompson, Grand Cayman (KY)

(*) Notice: Subject to any disclaimer, the term of this patent is extended or adjusted under 35 U.S.C. 154(b) by 0 days.

(21) Appl. No.: 15/360,465

(22) Filed: Nov. 23, 2016

(65) Prior Publication Data

US 2018/0139858 A1 May 17, 2018

Related U.S. Application Data

(63) Continuation-in-part of application No. 29/584,799, filed on Nov. 17, 2016.

(51) Int. Cl.
*H05K 5/02* (2006.01)
*H05K 5/03* (2006.01)

(52) U.S. Cl.
CPC ............. *H05K 5/0243* (2013.01); *H05K 5/03* (2013.01)

(58) Field of Classification Search
CPC .................................................. H05K 5/0243
USPC .......................................................... 428/99
See application file for complete search history.

(56) References Cited

U.S. PATENT DOCUMENTS

| | | | |
|---|---|---|---|
| 2,260,025 A * | 10/1941 | Hepperlen | H02B 1/00 200/17 R |
| D187,225 S | 2/1960 | Collins, Jr. | |
| D187,226 S | 2/1960 | Collins, Jr. | |
| D187,227 S | 2/1960 | Collins, Jr. | |
| D196,977 S | 11/1963 | Goldstein | |
| D214,380 S | 6/1969 | Moodie | |
| D272,338 S | 1/1984 | Bergoltz | |
| D318,652 S | 7/1991 | Buchanan | |
| 5,081,560 A | 1/1992 | Donnerstag | |
| D364,849 S | 12/1995 | De Waal | |
| D384,332 S | 9/1997 | Downie, Jr. | |
| 5,831,813 A | 11/1998 | Gomez | |
| 5,929,379 A | 7/1999 | Reiner et al. | |
| 6,076,696 A | 6/2000 | Neuman | |
| D490,104 S | 5/2004 | Lubking | |
| D490,114 S | 5/2004 | Dalmau-Salmons | |
| D511,543 S | 11/2005 | Lubking | |
| 8,901,421 B2 | 12/2014 | Texter | |
| 9,048,647 B2 | 6/2015 | Myers et al. | |

(Continued)

FOREIGN PATENT DOCUMENTS

| | | |
|---|---|---|
| CA | 171715 | 4/2018 |
| CA | 178368 | 4/2018 |

*Primary Examiner* — Brent T O'Hern
(74) *Attorney, Agent, or Firm* — Hanrahan Law Firm, P.A.; Benjamin M. Hanrahan

(57) ABSTRACT

A decorative cover for an electrical panel and a method of making or creating a decorative cover for an electrical panel is disclosed herein. The decorative cover includes inner and outer sections that are disposed in a covering relation with a different portion of the electrical panel, such as a door of the electrical panel, and an outer frame portion. The inner and outer sections of the decorative cover include an attachment undersurface, such a magnetic or adhesive surface, for attachment to the respective portions of the electrical panel. A decorative top or outer surface is provided with decorative or aesthetically pleasing patterns, designs, colors, or graphics.

17 Claims, 6 Drawing Sheets

(56) References Cited

U.S. PATENT DOCUMENTS

| | | |
|---|---|---|
| 9,325,158 B2 | 4/2016 | Nguyen et al. |
| D772,984 S | 11/2016 | Canchola et al. |
| D801,430 S | 10/2017 | Bagnell et al. |
| 9,859,692 B1 | 1/2018 | Lalancette et al. |
| 2001/0008702 A1 | 7/2001 | Vela |
| 2003/0170594 A1 | 9/2003 | Anderson et al. |
| 2006/0180332 A1 | 8/2006 | Dinh et al. |
| 2009/0263634 A1 * | 10/2009 | Hyer .................. E04F 13/002 428/195.1 |
| 2010/0046147 A1 | 2/2010 | Ranta |
| 2018/0205206 A1 | 7/2018 | Bazhinov |
| 2018/0218865 A1 | 8/2018 | Stevens et al. |

* cited by examiner

DECORATIVE COVER FOR AN ELECTRICAL PANEL AND METHOD OF MAKING THE SAME

CLAIM OF PRIORITY/CROSS REFERENCE TO RELATED APPLICATIONS

The present application is a Continuation-In-Part patent application of previously-filed, currently-pending U.S. design patent application Serial No. 29/584,799 filed on Nov. 17, 2016, the contents of which are incorporated herein in their entirety by reference.

FIELD OF THE INVENTION

The present invention is generally directed to a decorative cover, panel or overlay configured and/or adapted to be disposed in an at least partially overlying or covering relation to the front or exposed portion of a circuit breaker or other electrical panel. Many embodiments include a magnetic, adhesive or other attachment assembly structured to facilitate or allow a selective removable connection or attachment.

BACKGROUND OF THE INVENTION

Many homes, offices and other structures or buildings are equipped with metal (or other) electrical panels that are exposed to or are otherwise visible within common, high traffic or accessible areas (such as a foyer, living room, bedroom, etc.) Such electrical panels are often unsightly and can significantly degrade the aesthetics of the interior living or office facilities.

In particular, an electrical panel may be defined as including any circuit breaker panel, panelboard, distribution board or other like device, component or structure of an electricity supply system of a residential, commercial or other structure or building. The electrical panel generally functions to divide or distribute one or more electrical power feeds into subsidiary circuits, while also often providing a protective fuse or circuit breaker for each circuit. For instance, the electrical panel often includes a square, rectangular or other similar shape with a pivotal door that can be opened and closed to expose and hide the contents therein, such as one or more circuit breakers, fuses, cables, wires, connections, etc.

Accordingly, it would be beneficial to at least partially cover the electrical panel, and in particular, those electrical panels that are located in common, high traffic or easily visible areas. For instance, the cover could be customized or selected to fit the particular electrical panel and in some cases, to include custom or selected decorative elements, such as a patterns, colors, designs and other indicia to match or correspond with the décor of the room.

SUMMARY OF THE INVENTION

The present invention is directed to a decorative cover for an electrical panel and a method of making or creating a decorative cover for an electrical panel. For instance, the decorative cover of at least one embodiment includes detached or separate inner and outer sections that are disposed in a covering relation with a different portion of the electrical panel. Specifically, the inner section may be disposed in a covering relation with a door of the electrical panel, and the outer section may be disposed in a covering relation with an outer frame portion, generally surrounding the inner section.

Furthermore, both the inner and outer sections of the decorative cover include an attachment undersurface for attachment to the respective portions of the electrical panel. The attachment surfaces of at least one embodiment include a magnetic backing layer or a magnetic surface for removable, magnetic attached to the electrical panel. However, other embodiments may include an adhesive or other attachment surface structured to facilitate practice of the present invention in the intended manner.

It should also be noted that the decorative cover may also include an opening or cutout portion at least partially aligned with a handle of the electrical panel, such that access to the handle is not obstructed or is not substantially obstructed by the cover. This allows a user or individual to open the door of the electrical panel while the decorative cover remains attached to the outer surface, such as the door and/or outer frame portion.

These and other objects, features and advantages of the present invention will become more apparent when the drawings as well as the detailed description are taken into consideration.

BRIEF DESCRIPTION OF THE DRAWINGS

Like reference numerals refer to like parts throughout the several views of the drawings provided herein.

DETAILED DESCRIPTION OF THE INVENTION

Figure 1:
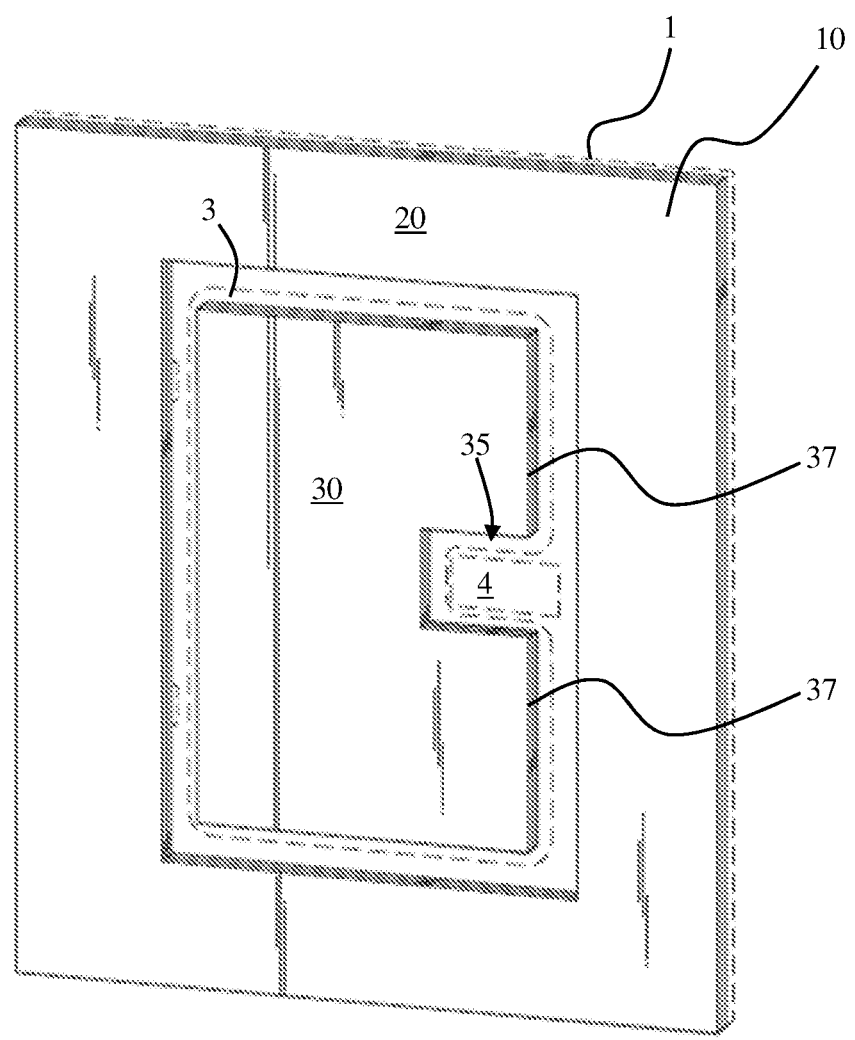
FIG. 1 is a front perspective view of the decorative cover of at least one embodiment disposed in an at least partially covering relation to an exemplary electrical panel.
Figure 2:
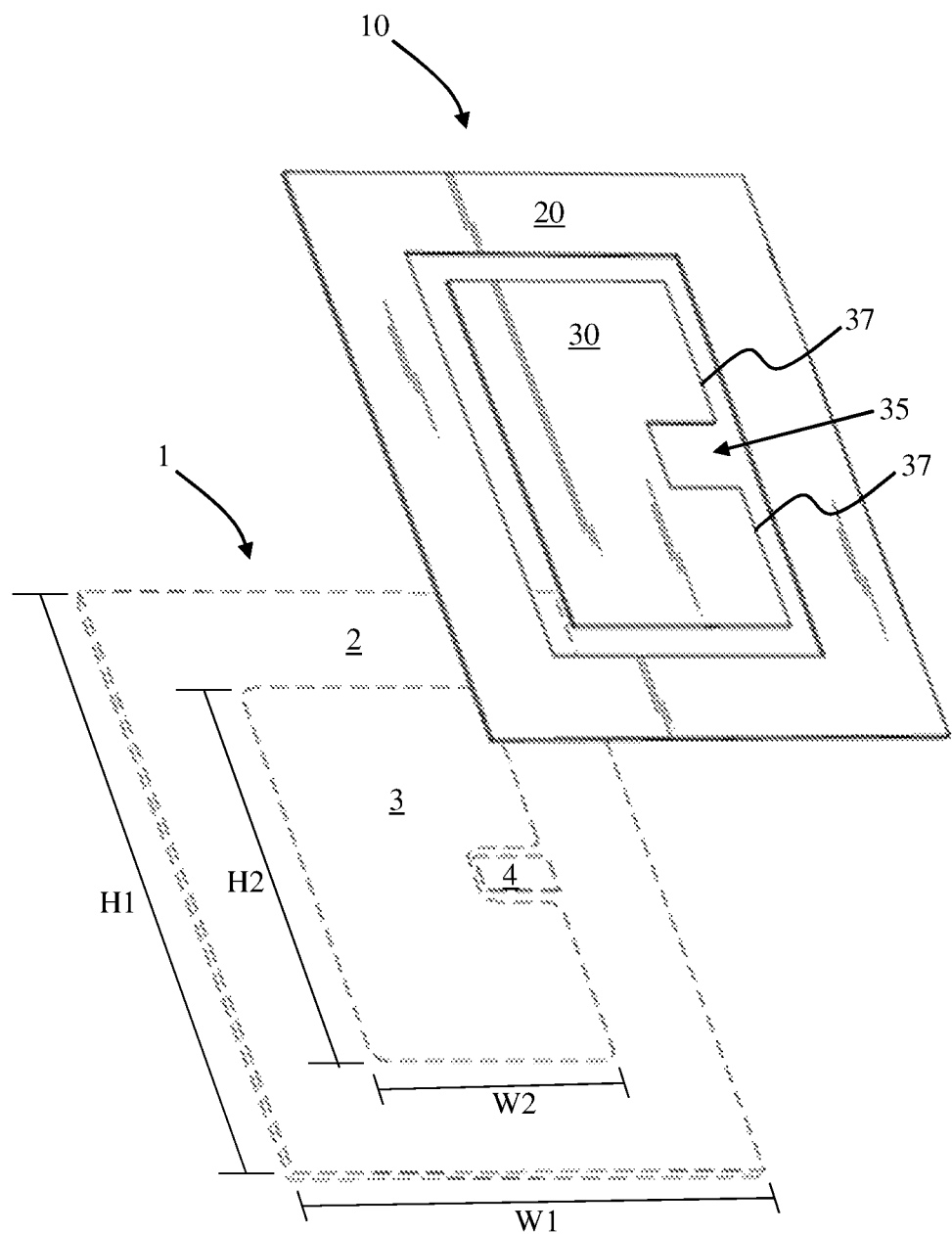
FIG. 2 is an exploded view of the decorative cover and an exemplary electrical panel as disclosed in accordance with at least one embodiment of the present invention.

As shown in the accompanying drawings, and with particular reference to FIGS. 1 and 2, the various embodiments of the present invention are directed to a decorative cover 10 configured or adapted to be disposed in an at least partially covering or overlying relation to an electrical panel 1.

In particular, an electrical panel 1, as used herein, includes any circuit breaker panel, panelboard, distribution board or other like device, component or structure of an electricity supply system of a residential, commercial or other structure or building that generally functions to divide or distribute one or more electrical power feeds into subsidiary circuits and/or while also often providing a protective fuse or circuit breaker for each circuit. For instance, the electrical panel 1 often includes a square, rectangular or other similar shape defined by an outer frame portion 2 and an inner, movable or pivotal door 3. For instance, the outer frame portion 2 of the electrical panel 1 often peripherally surrounds the inner door 3, as generally shown in FIG. 2, for example. Furthermore, a handle 4 may be disposed on a side of the door 3 for locking, latching or otherwise securely retaining the door 3 in the closed position, as shown in FIG. 2. Manipulation of the handle 4 allows a user to pivotally or movably open the door 3 in order to expose the electrical components (not shown) therein, such as one or more circuit breakers, fuses, cables, wires, connections, etc.

It should also be noted that, within the full spirit and scope of the disclosure provided herein, the electrical panel 1 can be constructed or can come in virtually any shape and size including a square shape, rectangular shape (as shown) or more elongated shapes. For instance, in some cases, the width of the electrical panel 1, such as the outer width W1 of the outer frame portion 2 thereof may be in the range of approximately five (5) inches to eight (8) inches, and the height H1 may be in the range of approximately twelve (12) inches to forty five (45) inches, although other dimensions of the width W1 and/or height H1 (greater or lesser) of the electrical panel 1 are contemplated and within the full scope of the present invention.

Furthermore, oftentimes, the electrical panel 1, and in particular, the outer surface of the frame portion 2 and/or the door 3 may be constructed or manufactured of a metallic and/or magnetic material such that other magnetic materials may be attracted or magnetically attached thereto.

Accordingly, in some embodiments, the present invention is directed to a decorative cover 10 for attachment to an outer surface of an electrical panel 1. The decorative cover 10 can be sized and constructed to correspondingly fit at least partially, substantially or completely over the outer surface of the electrical panel 1, including the outer frame portion 2 and/or the inner door 3, thereof. For instance, in at least one embodiment, the decorative cover 10 includes an outer section 20 and an inner section 30 such that the outer section 20 is disposed in an at least partially overlying relation with the outer frame portion 2 of the electrical panel 1, and the inner section 30 is disposed in an at least partially overlying or covering relation with the door 3 of the electrical panel 1. It should be noted that some embodiments or implementations may include only one of the outer section or inner section, however, many instances of the decorative cover 10 will include both.

Moreover, in at least one embodiment, the inner section 30 and the outer section 20 include attachment surfaces 34, 24, respectively, structured to attach the corresponding section 30, 20 to a different portion of the electrical panel 1. For example, the cover 10 of certain embodiments of the present invention may be removably attached to an outer surface of the electrical panel 1, such that a user or individual can selectively position the cover 10 upon the electrical panel 1, remove the cover 10, replace the cover 10, etc.

Figure 3:
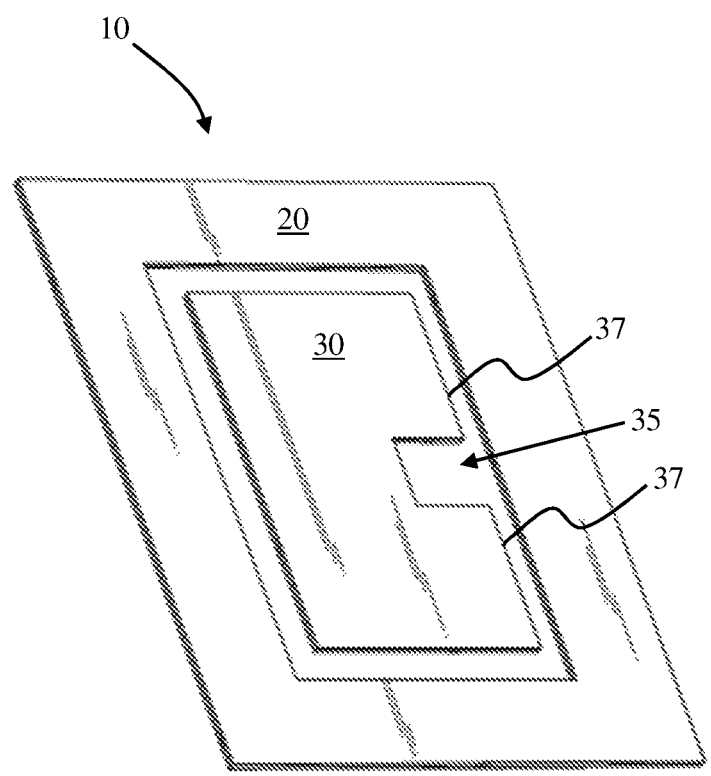
FIG. 3 is a perspective view of the decorative cover as disclosed in accordance with at least one embodiment of the present invention.

Accordingly, in one exemplary embodiment, the cover 10, and in particular, the inner section 30 and outer section 20, may comprise a magnetic attachment surface such that the undersurface 24 of the inner and/or outer section 20, 30 is magnetic. This allows the inner and/or outer sections 20, 30 of the cover 10 to be magnetically attached in a removable manner to the electrical panel 1. Specifically, in such an embodiment, the inner section 30 can be removably and magnetically attached to the door portion 3 of the electrical panel 1, and the outer section 20 can be removably and magnetically attached to the surrounding frame portion 2 of the electrical panel 1. Accordingly, when both the inner and outer sections 20, 30 of the cover 10 are magnetically or otherwise attached to the electrical panel 1, in some embodiments, the outer section 30 will at least substantially peripherally surround the inner section 30, as generally shown in FIGS. 1, 2 and 3.

Figure 4:
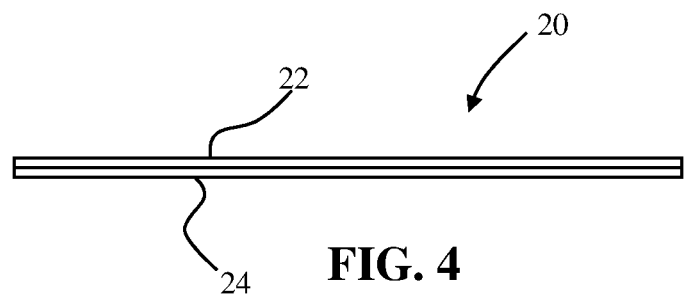
FIG. 4 is an end view of the outer section of the decorative cover as disclosed in at least one embodiment of the present invention.
Figure 5:
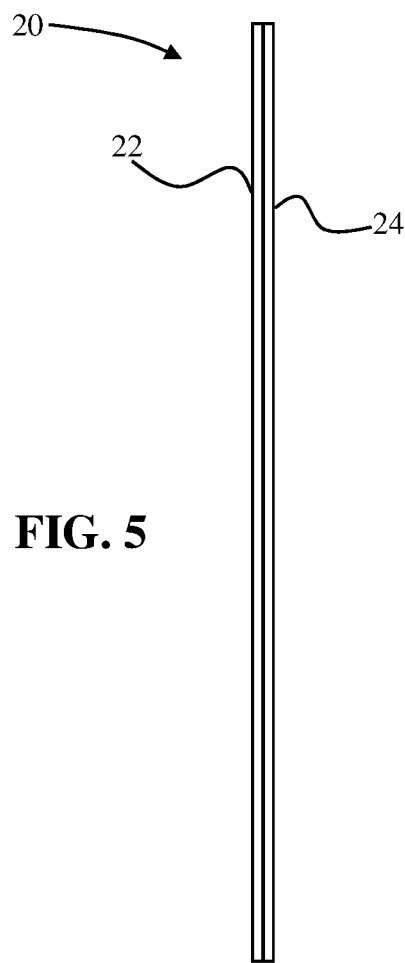
FIG. 5 is a side view of the outer section of the decorative cover as disclosed in at least one embodiment of the present invention.

Referring now to FIGS. 4 and 5, a top view (FIG. 4) and a side view (FIG. 5) of the cover 10 and/or outer section 20 of the cover 10 is shown. For instance, in this embodiment, the outer section 20 of the cover 10 includes at least two layers comprising a lower or bottom attachment layer 24 (e.g., magnetic surface) and a decorative top layer 22. The two layers 22, 24 may be fixedly secured to one another, for example, by adhesive, heat attachment, thermal fusing, etc. In at least one embodiment, the decorative top layer 22 may comprise a vinyl sheet or other material, including, but in no way limited to fabric, plastic, paper, or the like, attached to the magnetic backing or attachment layer 24. Although not shown in the figures, the decorative top layer 22 may include a decorative pattern, graphics, artwork, words, phrases, designs, or other generally aesthetically pleasing indicia. The indicia may be printed on the outer or top decorative layer, etched, sketched, engraved, hand drawn, computer generated, etc. In other words, the manner in which the indicia is printed, written or otherwise marked upon the decorative layer 22 should not be limited.

Figure 6:
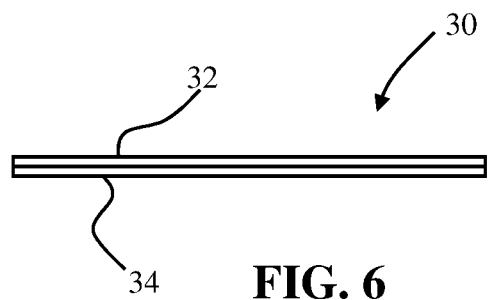
FIG. 6 is an end view of the inner section of the decorative cover as disclosed in at least one embodiment of the present invention.
Figure 7:
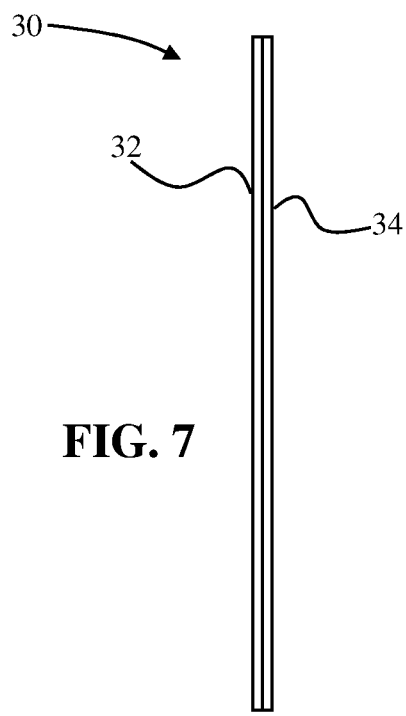
FIG. 7 is a side view of the inner section of the decorative cover as disclosed in at least one embodiment of the present invention.

Similarly, referring now to FIGS. 6 and 7, a top view (FIG. 6) and a side view (FIG. 7) of the inner section 30 of the cover 10 is shown. For instance, in this embodiment, the inner section 30 of the cover 10 includes at least two layers comprising a lower or bottom attachment layer 34 (e.g., magnetic surface) and a decorative top layer 32. The two layers 32, 34 may be fixedly secured to one another, for example, by adhesive, heat attachment, thermal fusing, etc. In at least one embodiment, the decorative top layer 32 may comprise a vinyl sheet or other material, including, but in no way limited to fabric, plastic, paper, or the like, attached to the magnetic backing or attachment layer 34. Although not shown in the figures, and similar to the outer section 20, the decorative top layer 32 of the inner section 30 may include a decorative pattern, graphics, artwork, words, phrases, designs, or other generally aesthetically pleasing indicia. The indicia may be printed on the decorative layer 32, etched, sketched, engraved, hand drawn, computer generated, etc. In other words, the manner in which the indicia is printed, written or otherwise marked upon the decorative layer 32 should not be limited.

Furthermore, it is contemplated within the full spirit and scope of the various embodiments of the present invention that the attachment layers 24, 34 of the outer and inner sections 20, 30, respectively, may include an adhesive surface such that the cover 10, and in particular, the inner and outer sections 20, 30 thereof, may be adhesively attached or applied to the electrical panel 1. Other embodiments may use a static cling surface or other attachment surfaces structured to facilitate the practice of the present invention in the intended manner, and in particular, to attach the cover 10 to the electrical panel 1, either in a removable or generally non-removable manner. For instance, in the case of an adhesive backing or adhesive attachment layer, some adhesives may be selected such that the cover 10 can be easily removable and used again, while other adhesives may be selected such that the cover 10 is not easily removable from the electrical panel 1. Other embodiments of the attachment layer or surface can include VELCRO or other like removable attachment structures.

Also, in yet another embodiment, it should be noted that the outer and inner sections 20, 30 of the cover 10 may be constructed of a single layer such that the decorative indicia is imprinted on a top surface of the single layer and the attachment surface is disposed on the bottom, facing the electrical panel. As an example, the outer and/or inner sections 20, 30 of the cover 10 may include a single layer with a magnetic attachment surface on one side and decorative indicia imprinted directly on the other (top or exposed) side. As another example, the outer and inner sections 20, 30 of the cover 10 may include a single layer with an adhesive surface on one side and decorative indicia imprinted directly on the other (top or exposed) side.

Referring again to FIGS. 1, 2 and 3, the inner section 30 and outer section 20 of at least one embodiment of the present invention may be completely detached from one another such that each of the inner section 30 and outer section 20 are separate from one another, and separately attached and/or detached from the electrical panel 1, as desired. This can also allow the inner section 30 to move freely and independently from the outer section 20, particularly since the inner section 30 of certain embodiments may be attached to a movable door 3.

Furthermore, still referring to FIGS. 1, 2, and 3, the inner section 30 of at least one embodiment includes at least one open region 35 correspondingly disposed in an at least partially aligned relation with a handle 4 of the door portion 3 of the electrical panel 1. For instance, the handle 4 is used to open and close the door 3, and therefore, the handle 4 must be at least partially accessible even when the cover 10, and in particular, the inner section 30, is disposed in a covering relation with the electrical panel 1. In this manner, as shown in FIG. 1, for example, the handle 4 is at least partially accessible through the open region in order to facilitate a selective opening and closing of the door 3.

For example, as shown in FIGS. 1, 2 and 3, the open region 35 of the inner section 30 may comprise a hole or opening extending from an outer, peripheral or side edge 37 in order to reveal a portion of the handle 4 there through. For instance, the opening or open region 35 may include a rectangularly shaped or square shaped opening that extends from or otherwise shares a side with the peripheral edge 37 of the inner section 30. Other embodiments, however, may include an opening or open region 35 that is fully within the inner section 30, such that the outer edge 37 of the inner section 30 is not broken or is otherwise continuous.

Figure 8:
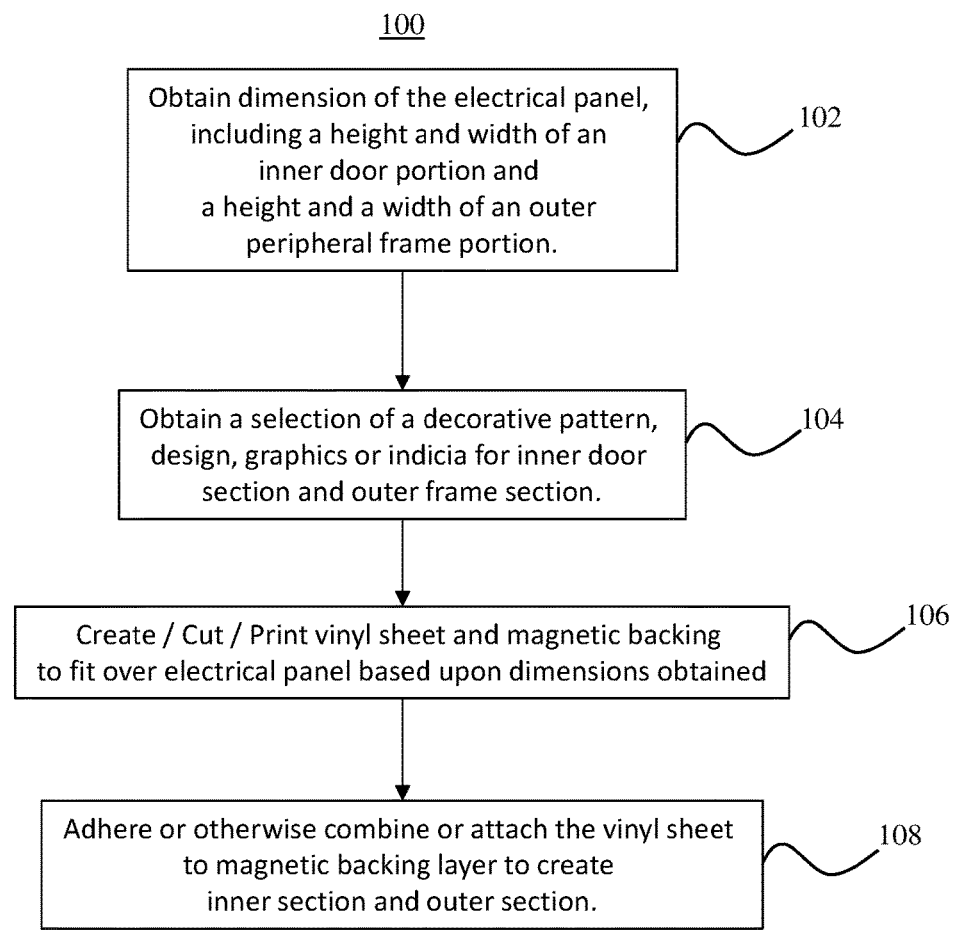
FIG. 8 is a high level flow chart illustrating a method of creating a decorative cover as disclosed in at least one embodiment of the present invention.

Referring now to FIG. 8, at least one embodiment of the present invention further includes a method 100 for making a decorative cover for an electrical panel. Specifically, as shown at 102, the method 100 may include obtaining the dimensions of an electrical panel upon which the decorative cover will be disposed. Accordingly, the dimensions may include an outer height H1 and width W1 of the electrical panel 1, such as an outer, peripheral height and width of the frame portion 2 of the electrical panel 1. The dimensions may also include a height H2 and width W2 of the door 3, as generally shown in FIG. 2. Other dimensions may also define or represent the location, size and shape of the handle 4. It should be noted that, depending on the size, shape, and/or type of electrical panel 1, other dimensions, shapes, etc. may be measured and included as part of obtaining the dimensions 102 of the electrical panel 1. Furthermore, it should be noted that the dimensions may be obtained in a number of different manners, for example, by a customer, user or individual physically measuring a particular electrical panel, by contacting a manufacturer, distributor, or retailer of an electrical panel, by referencing specification sheets or other like references that may include the dimensions for a particular make/model of an electrical panel, by referencing a database of measurements previously obtained and recorded, etc.

In any event, as shown at 104, the method 100 further includes obtaining a selection of a decorative surface or decorative element for the inner and outer sections of the decorative cover. In particular, the customer, user or other individual may select from a list or showing of example decorative patterns, graphics, or other indicia, or in some embodiments, the customer, user or other individual may customize the decorative element(s), as desired. For instance, in some embodiments, a customer, user or other individual may upload his or her own graphics, indicia or designs to a website, application, kiosk or other like device for application to the decorative cover of the present invention. In this manner, the decorative element(s) may be selected based upon previously designed covers, for example, or selected by customizing or custom designing the inner and/or outer sections. This allows the customer, user or other individual to ensure that the decorative cover will match his or her décor in the home, office, etc. or otherwise fit the customer's specific needs or desires.

Once the dimensions are obtained and the decorative element(s) are selected or defined, the method 100 further includes creating the inner and outer sections of the decorative cover, as shown at 106. For instance, in some embodiments, creating the inner and outer sections of the decorative cover may include printing, etching, painting, sketching, or otherwise placing the selected design or decorative elements onto a top, decorative surface of the inner and outer sections. As described herein, the inner and outer sections of certain embodiments may each be constructed of a single layer or multiple layers. In the case of a single layer, the decorative elements may be printed or otherwise placed on the outer or upper surface of the inner and/or outer sections, wherein the undersurface includes an attachment surface, such as a magnetic backing, adhesive backing, etc. In the embodiment where the inner and/or outer sections comprise multiple layers (e.g., an outer vinyl layer and an under magnetic or attachment layer), the decorative elements may be printed or otherwise placed on the outer layer and the two layers can be adhered, fused, or otherwise fixedly attached to one another, as shown at 108.

It should also be noted that creating the inner and outer sections 106 may also include cutting the sections in a manner such that their dimensions will at least partially correspond to the dimensions of the electrical panel. In particular, the outer section should be sized to fit upon the outer frame portion of the electrical panel and not obstruct the opening and closing of the door. Similarly, the inner section should be dimensioned to fit upon the door and to not obstruct the opening and closing thereof. In some embodiments, as described herein, the inner section (and/or the outer section) may include a notch or opening 35 structured to at least partially align with a handle, such that that handle can be accessed and the door can be opened and closed to access and hide the inner contents of the electrical panel.

Since other modifications and changes varied to fit particular operating requirements and environments will be apparent to those skilled in the art, the invention is not considered limited to the example chosen for purposes of disclosure, and covers all changes and modifications which do not constitute departures from the true spirit and scope of this invention. This written description provides an illustrative explanation and/or account of the present invention. It may be possible to deliver equivalent benefits using variations of the specific embodiments, without departing from the inventive concept. This description and these drawings, therefore, are to be regarded as illustrative and not restrictive.

Now that the invention has been described,

What is claimed is:

1. A decorative cover for an electrical panel, the electrical panel comprising an outer frame portion and an inner movable door, said decorative cover comprising:
    an inner section and an outer section, both disposed in a covering relation with a different portion of the electrical panel,
    said inner section comprising an attachment surface structured to attach to the inner movable door of the electrical panel,
    said inner section further comprising at least one open region corresponding to at least a portion of a handle of the inner movable door of the electrical panel, wherein said at least one open region allows access to the handle there through,
    said outer section comprising an attachment surface structured to attach to the outer frame portion of the electrical panel, said outer section being structured to at least substantially peripherally surround said inner section when said decorative cover is disposed on the electrical panel, and
    wherein said outer section comprises an inner edge defining an opening, said inner section being disposed within said opening of said outer section, said inner section comprising an outer peripheral edge disposed in a spaced relation from said inner edge of said outer section.

2. The decorative cover as recited in claim 1 wherein said attachment surface of said inner section is structured to removably attach said inner section to the movable door of the electrical panel.

3. The decorative cover as recited in claim 2 wherein said attachment surface of said outer section is structured to removably attach said outer section to the outer frame portion of said electrical panel.

4. The decorative cover as recited in claim 3 wherein said attachment surface of said inner section and said attachment surface of said outer section comprise magnetic surfaces.

5. The decorative cover as recited in claim 1 wherein said inner section is defined by a magnetic backing layer and a decorative top layer.

6. The decorative cover as recited in claim 5 wherein said decorative top layer of said inner section comprises a vinyl sheet attached to said magnetic backing layer of said inner section.

7. The decorative cover as recited in claim 6 wherein said outer section is defined by a magnetic backing layer and a decorative top layer.

8. The decorative cover as recited in claim 7 wherein said decorative top layer of said outer section comprises a vinyl sheet attached to said magnetic backing layer of said outer section.

9. The decorative cover as recited in claim 1 wherein said inner section comprises a single layer with a magnetic undersurface and a decorative top surface.

10. The decorative cover as recited in claim 9 wherein said outer section comprises a single layer with a magnetic undersurface and a decorative top surface.

11. The decorative cover as recited in claim 1 wherein said at least one open region of said inner section comprises a hole extending from an outer side edge of said inner section to reveal a portion of the handle there through.

12. The decorative cover as recited in claim 11 wherein said at least one open region comprises a rectangularly shaped opening extending from said outer side edge of said inner section.

13. A decorative cover for an electrical panel, said decorative cover comprising:
    an inner section and an outer section,
    said inner section comprising a magnetic surface and a top decorative surface, said magnetic surface being structured to magnetically and removably attach to and at least partially cover an initially exposed surface of a pivotal door of the electrical panel,
    said inner section further comprising at least one open region correspondingly disposed in an at least partially aligned relation to a portion of a handle of the pivotal door of the electrical panel, wherein the handle is at least partially accessible through said at least one open region in order to facilitate a selective opening and closing of the pivotal door,
    said outer section comprising a magnetic surface and a top decorative surface, said magnetic surface being structured to magnetically and removably attach to and at least partially cover an initially exposed surface of a peripheral frame portion of the electrical panel, said outer section being structured to peripherally surround said inner section when said decorative cover is disposed on the electrical panel,
    said outer section comprises an inner edge defining an opening, wherein said inner section is disposed within said opening of said outer section, and
    said inner section comprises an outer peripheral edge disposed in a spaced relation from said inner edge of said outer section.

14. The decorative cover as recited in claim 13 wherein said inner section and said outer section are completely unattached from one another.

15. The decorative cover as recited in claim 14 wherein said inner section is defined by a magnetic backing layer and a separate decorative top layer attached to one another, and said outer section is defined by a magnetic backing layer and a separate decorative top layer attached to one another.

16. The decorative cover as recited in claim 15 wherein said decorative top layer of said inner section comprises a vinyl sheet attached to said magnetic backing layer of said inner section, and said decorative top layer of said outer section comprises a vinyl sheet attached to said magnetic backing layer of said outer section.

17. The decorative cover as recited in claim 1 wherein said inner section comprises a single layer with a magnetic undersurface and a decorative top surface, and wherein said outer section comprises a single layer with a magnetic undersurface and a decorative top surface.

* * * * *